United States Patent [19]

Minamihata et al.

[11] Patent Number: 4,789,884
[45] Date of Patent: Dec. 6, 1988

[54] IIL CIRCUIT WITH PNP INJECTOR

[75] Inventors: Shigeaki Minamihata, Takasaki; Kazuyuki Kamegaki, Tamamura, both of Japan

[73] Assignee: Hitachi, Ltd., Tokyo, Japan

[21] Appl. No.: 851,826

[22] Filed: Apr. 14, 1986

[30] Foreign Application Priority Data

Apr. 12, 1985 [JP] Japan .................................. 60-76554
Apr. 24, 1985 [JP] Japan .................................. 60-86384
Apr. 24, 1985 [JP] Japan .................................. 60-86385

[51] Int. Cl.$^4$ ............................................. H01L 29/72
[52] U.S. Cl. ........................................ 357/34; 357/92; 357/46; 357/40; 307/459; 307/477
[58] Field of Search .................. 357/92, 46, 34, 36, 357/40; 307/459, 477

[56] References Cited

U.S. PATENT DOCUMENTS

| 4,109,162 | 8/1978 | Heuser et al. | 357/92 X |
| 4,277,701 | 7/1981 | Hornung et al. | 357/92 X |
| 4,277,794 | 7/1981 | Nuzillat | 357/92 X |
| 4,301,382 | 11/1981 | Kameyama | 357/92 X |
| 4,404,737 | 9/1983 | Kanzaki et al. | 357/92 X |
| 4,740,720 | 4/1988 | Newman | 357/92 X |

FOREIGN PATENT DOCUMENTS

| 50153323 | 6/1977 | Japan | 307/477 |
| 56-141624 | 11/1981 | Japan | 307/477 |

Primary Examiner—Andrew J. James
Assistant Examiner—William A. Mintel
Attorney, Agent, or Firm—Antonelli, Terry & Wands

[57] ABSTRACT

A multi-stage IIL circuit is provided which includes common IIL elements each using a PNP transistor as an injector and an NPN transistor as an inverter, and inverse IIL elements each using an NPN transistor as an injector and a PNP transistor as an inverter.

9 Claims, 6 Drawing Sheets

IIL CIRCUIT WITH PNP INJECTOR

BACKGROUND OF THE INVENTION

This invention relates generally to a semiconductor integrated circuit device (IC) equipped with an IIL circuit (Integrated Injection Logic), and more particularly to a technique which can be used suitably for a stacked IIL circuit.

In bipolar ICs which have a high integration (packing) density and in which analog and digital circuits are integrated on the same substrate, IIL circuits have an excellent feature in that they can be formed by the same technique as that used for analog circuits.

An IIL circuit can be operated at an operating voltage of about 0.7 V (which is approximate to the base-emitter voltage of a bipolar transistor). A conventional IC operates at 5 V, for example. For conventional IIL circuits, therefore, only about 0.7 V of the 5 V power source voltage can be utilized effectively, and the balance of 4.3 V is not used at all. In other words, the utilization rate of the power source voltage is low and the power consumption is great.

The inventors of the present invention have conducted tests to form an IIL circuit having a multi-stage structure (or a stacked structure) by connecting in series a plurality of IIL elements between the power source $V_{cc}$ and a ground potential (reference potential) in order to effectively utilize the power source voltage.

IIL circuits of a two-stage stacked structure have already been successfully developed by Hitachi, Ltd. However, IIL circuits with a stacked structure of three or more stages have not yet been successfully developed because a number of problems develop when additional stages are added beyond the second stage.

The present invention has been developed as a result of intensive studies on the development of IILs having a stacked structure of three or more stages.

SUMMARY OF THE INVENTION

The following will illustrate a typical example of the present invention.

In order to accomplish a multi-stage IIL circuit having a stacked structure, the present invention employs the following construction.

(1) The present invention uses a common IIL element (common IIL; hereinafter called "C-IIL") using a PNP transistor as an injector transistor and an NPN transistor as an inverter, and an inverse IIL element (hereinafter called "i-IIL") using an NPN transistor as an injector transistor and a PNP transistor as an inverter. In other words, the present invention uses two kinds of IIL elements. The i-IIL is primarily used for the signal transfer from an upper stage (a higher bias stage) to a lower stage (a lower bias stage).

(2) In item (1) described above, and more preferably when connecting the C-IIL to the i-IIL, one of a plurality of inverter outputs producing the signal is connected to its input terminal to constitute a current mirror circuit.

(3) When the signal is transmitted from the lower stage (the lower bias stage) to the upper stage (the higher bias stage) by use of the C-IIL, the signal transmission is effected via at least two inverters in each stage.

(4) In rder to accomplish the i-IIL inside the semiconductor substrate, an element of a SIdewall base COntact structure (SICOS), for example, is used. The SICOS technique will be described later.

DESCRIPTION OF THE PREFERRED EMBODIMENTS

First of all, the problems with the prior art clarified by the present inventors will be described. Following this, the definite content of the present invention will then be described.

Problems with the Prior Art Clarified by the Present Inventors

Figure 1A:
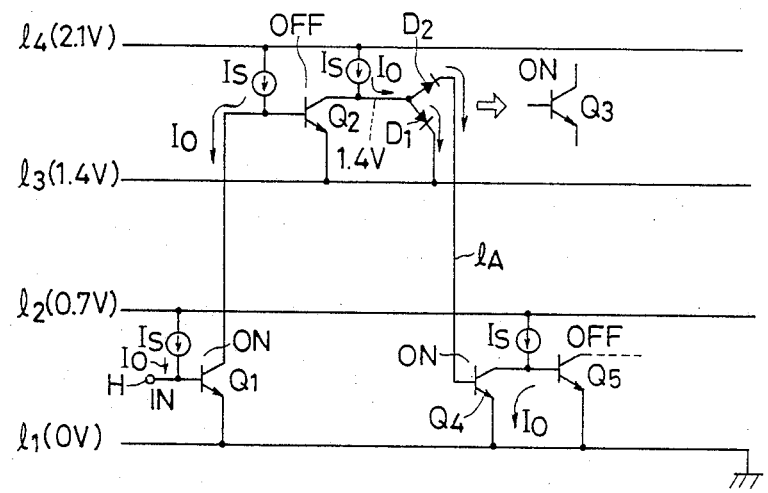
FIGS. 1(a) and 1(b) are circuit diagrams that are useful for explaining the problems clarified by the inventors of the present invention.
Figure 1B:
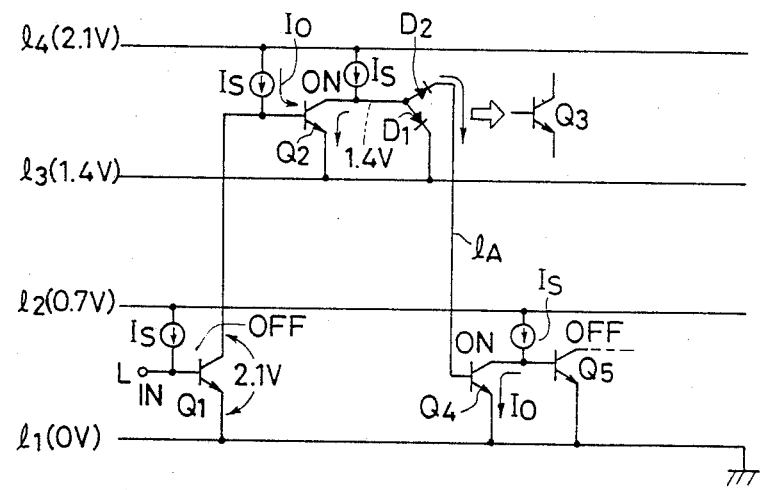

An IIL element typically consists of a PNP transistor operating as an injector and an NPN transistor operating as an inverter. FIGS. 1(a) and 1(b) show the problems when an IIL circuit having a three-stage stacked structure is constituted by using the typical IIL element. In the drawings, the injector consisting of a PNP transistor has been replaced by a constant current source $I_S$.

FIGS. 1(a) and 1(b) show the same circuit, but (a) shows the operation state of the circuit when a high level signal 0.7 V) is applied to the input terminal IN (the base of a transistor $Q_1$), while (b) shows the case when a low level signal (0 V) is applied thereto. As shown in the diagrams, voltages which are incrementally different from one another by 0.7 V are applied to lines $l_1$ through $l_4$, respectively. In the drawings, a transistor $Q_3$ is shown composed of two diodes $D_1$ and $D_2$ whose anodes are connected in common for purposes of explanation of the circuit operation. It is assumed also that a current delivered by each injector $I_S$ is $I_O$ and an emitter ground current amplification ratio $\beta_i$ of the inverse NPN transistor is 1.

Let us consider FIG. 1(a). When the input becomes "H", the transistor $Q_1$ is turned on while the transistor $Q_2$ is turned off. Then a constant current $I_O$ flows into the base of the transistor $Q_3$ and this transistor $Q_3$ goes into saturation. Therefore, a part of the constant current $I_O$ flows to the base of the NPN transistor $Q_4$ of the lower stage through the diodes $D_2$ between the base and the collector, and hence the transistor $Q_4$ is turned on.

When the transistor $Q_4$ is turned on, the base of the transistor $Q_3$ (the common junction of the diodes $D_1$ and $D_2$) is clamped substantially at 1.4 V, and the transistor $Q_5$ is turned off.

Next, let us consider FIG. 1(b). When the input become "L", the transistor $Q_1$ is turned off while the transistor $Q_2$ is turned on. This transistor $Q_2$ goes into saturation, and its collector potential reaches substantially 1.4 V. Then, part of the constant current $I_O$ naturally flows to the collector-emitter path of the transistor $Q_2$, but since the diode $D_2$ between the base and collector of the transistor $Q_3$ is forwardly biased and becomes conductive, a current also flows so that the transistor $Q_4$ is eventually turned on in the same way as in the case of FIG. 1(a).

In other words, the transistor $Q_4$ is turned on irrespective of the "H" and "L" level of the input, and signal transmission cannot be successfully carried out. This is the first problem with the prior art.

The second problem lies in the breakdown voltage of the transistors $Q_1$ and $Q_2$.

Consider the transistor $Q_1$ in FIG. 1(b). A potential of about 2.1 V (3 $V_{BE}$) is applied across the emitter and collector of the transistor $Q_1$ while it is turned off. An ordinary inverse NPN transistor has an emitter-collector breakdown voltage of about 1.4 V. Therefore, given the arrangement of FIG. 1(b), the transistor $Q_1$ breaks down when it is turned off.

Next, consider the potential between the base and collector of the transistor $Q_2$ in FIG. 1(a). The base of this transistor $Q_2$ is at ground potential, and its collector is at 2.1 V (3 $V_{BE}$. Therefore, if any manufacturing defects or other flaws exist in transistor $Q_2$, this transistor $Q_2$ is also likely to break down.

The problems described above can be summarized as follows.

(1) When a signal is transmitted from a transistor of a higher bias stage which is higher by at least two stages than a transistor of a lower stage, the transistor of the lower bias stage is always kept ON irrespective of the "H" and "L" level of the input signal.

(2) When a signal is directly transmitted between a transistor of a lower bias stage and a transistor of a higher bias stage which is higher by at least two stages, the breakdown voltages of the two transistors become a problem. Particularly, the transistor of the lower bias stage is more likely to break down.

Embodiment 1

Figure 2:
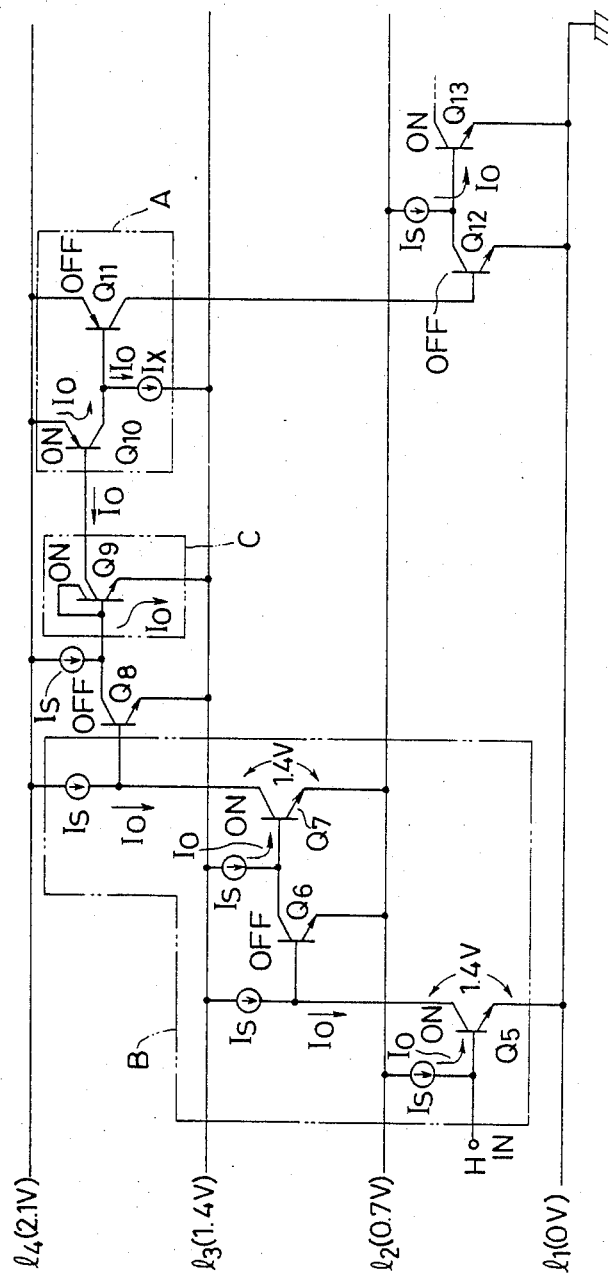
FIG. 2 is a circuit diagram showing a first embodiment of the present invention.

The present invention has three primary characterizing features. FIG. 2 illustrates these.

(1) The IIL circuit of the invention uses an IIL element (i-IIL) which in turn uses an NPN transistor as an injector and a PNP transistor as an inverter. This is a novel IIL element which differs from the conventional concept that an injector must be a PNP transistor and an inverter must be an NPN transistor. This i-IIL has excellent signal transfer characteristics from an upper stage to a lower stage, and is primarily used for signal transmission in this case.

As a result, the problem (1) mentioned previously which was clarified by the present inventors can be solved by this i-IIL element.

(2) When a signal is transmitted from an IIL of a lower bias stage to an IIL of a higher bias stage which is higher by at least two stages (by use of a common IIL (C-IIL), the present invention uses a structure in which each stage is not connected directly. Instead, these stages are connected through at least two inverters. This structure can solve the problem (2) mentioned previously which was clarified by the present inventors.

(3) The third characterizing feature of the present invention solves the problem that might occur in the signal transmission between i-IIL elements and C-IIL elements described in item (1) (which is also clarified by the present inventors). In other words, the present invention employs a structure in which on output of a plurality of outputs of the output inverter of an IIL element outputting the signal in the connection i-IIL and C-IIL is connected to the input terminal thereof in such a manner as to constitute a current mirror circuit.

This structure realizes matching between an injection current quantity that is drawn in and an injection current quantity that is pumped out, and ensures stable operation.

Hereinafter, the present invention will be described in further detail with reference to FIG. 2.

Circuit Operation

FIG. 2 shows an IIL circuit of a three-stage stacked structure. The operation of this circuit will be explained first.

As shown in the drawing, when the input (IN) is at the high ("H") level, the transistor $Q_5$ is turned on, the transistor $Q_7$ is turned on, the transistor $Q_9$ is also turned on, and the transistor $Q_{10}$ is then turned on. The current $I_O$ delivered from the collector of the PNP transistor $Q_{10}$ is absorbed by the constant current source $I_X$ (which always draws the current $I_O$), so that the base current is not supplied to the PNP transistor $Q_{11}$ and this transistor $Q_{11}$ is consequently turned off.

As a result, the transistor $Q_{12}$ is turned off and the transistor $Q_{13}$ is turned on.

Next, the operation when the input becomes "L" will be explained. (This case is not illustrated in the drawing.) In this case, each transistor assumes the reverse operation state to the above. Namely, the transistor $Q_5$ is turned off, $Q_6$ is turned on, $Q_7$ is turned off, $Q_8$ is turned on and $Q_9$ is turned off. As the transistor $Q_9$ is turned off, the base current is not supplied to the transistor $Q_{10}$, and the PNP transistor $Q_{10}$ is turned off. Then, the current $I_O$ which is otherwise drawn by the constant current source $I_X$ is supplied as the base current to the base of the transistor $Q_{11}$. Therefore, this transistor $Q_{11}$ is turned on. Consequently, the base of the transistor $Q_{12}$ is driven and the transistor $Q_{12}$ is turned on with the transistor $Q_{13}$ being turned off.

It is evident from the description given above that this IIL circuit having a three-stage structure can effect signal transmission in response to the levels "H" and "L" of the input signal (IN).

Features (a) Adoption of Inverse IIL (i-IIL)

The portion A encompassed by dotted line in FIG. 2 represents a i-IIL. This i-IIL can sufficiently drive the transistor $Q_{12}$ of the lower stage by the current delivered from the collector of the output PNP transistor $Q_{11}$.

Since the diodes between the bases and emitters of the transistors do not exist in series in the path ranging from the 2.1 V line $l_4$ to the 0 V line $l_1$ through the transistors $Q_{11}$ and $Q_{12}$, the base potential of the output inverter $Q_{11}$ is not clamped. For this reason, signal transmission is excellent particularly from an upper stage to a lower stage. Further, the problem (1) previously mentioned does not occur.

It is important that when i-IIL is formed, the emitter-ground current amplification ratio of the PNP transistor constituting the inverter be stably secured above a predetermined value, and when integrated, the area occupied by the i-IIL be substantially equal to that of the conventional IIL (C-IIL).

Figure 6A:
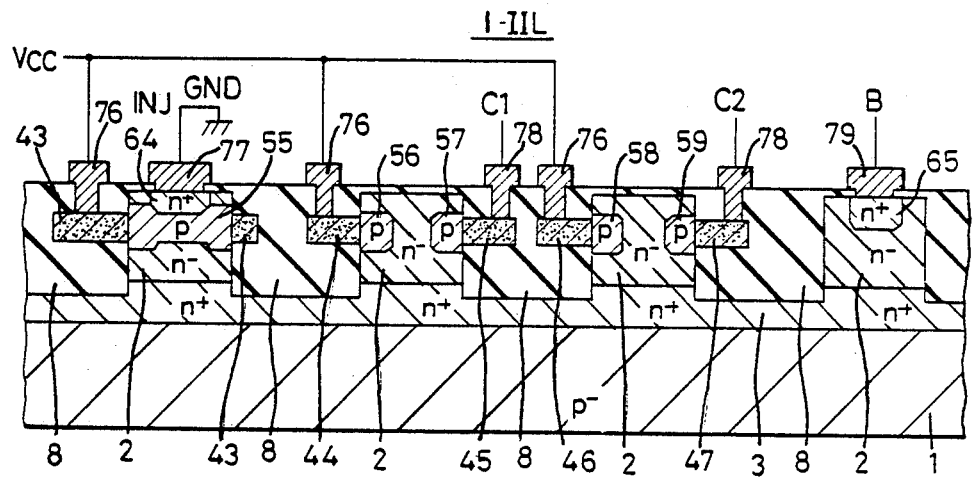
FIG. 6(a) is a sectional view of an IC when the circuit construction shown in FIG. 6(b) is realized in a semiconductor substrate by way of example.
Figure 6B:
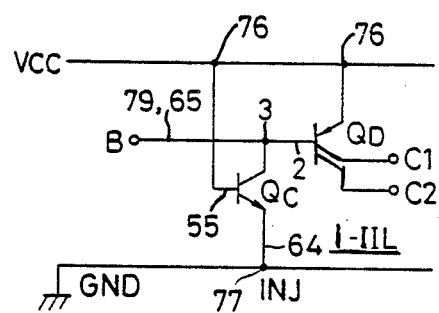
FIG. 6(b) is a circuit diagram of an inverse IIL (i-IIL)

FIG. 6(a) shows an example of a device structure i-IIL satisfying these requirements. FIG. 6(b) is a circuit diagram showing the basic circuit structure corresponding to FIG. 6(a).

The i-IIL shown in the drawing is a sidewall base contact type IIL (SICOS-IIL).

The SICOS technique as developed by Nakamura et al of Central Research Institute of Hitachi, Ltd., was introduced in "Semiconductor World", May, 1983, pp. 28-31.

The SICOS technique is characterized in that only an intrinsic region, which contributes to a practical transistor operation, is formed inside a silicon substrate, and the portions other than the intrinsic region are completely isolated by an oxide film ($SiO_2$). The base contact is taken out from the sidewall ($SiO_2$ film) of the intrinsic base region with a polycrystalline silicon layer.

The polycrystalline silicon base contact thus taken out is formed inside the oxide film that is buried. Therefore, a parasitic region of the base that is, the portion which does not contribute to the practical transistor operation but serves as the base spreading resistance in the prior art devices) is completely isolated electrically from the substrate, so that the transistor characteristics can be significantly improved.

The SICOS IIL consists of a $p^-$-type silicon semiconductor substrate 1, an $n^-$-type silicon epitaxial layer 2 (0.8 μm thick), an $n^+$-buried layer 3, polysilicon layers 43, 44, 45, 46 and 47 containing a p-type impurity, p-type diffusion layers 55, 56, 57, 58 and 59, $n+$-type diffusion layers 64 and 65, electrodes 76, 77, 78 and 79 and an oxide layer 8. The p-type diffusion layers 55, 56, 57, 58 and 59 are formed by doping a p-type impurity (e.g., boron) into the $n^-$-type epitaxial layer from the polycrystalline silicon layers 43, 44, 45, 46 and 47.

This technique can reliably secure the current amplification ratio of the PNP transistor above a predetermined value while the size of the resulting i-IIL circuit is substantially equal to that of the NPN transistor.

The common IIL (C-IIL) may naturally have the conventional device structure, but since the SICOS technique is used to fabricate the i-IIL, the C-IIL is preferably fabricated by the same process technique.

Figure 7A:
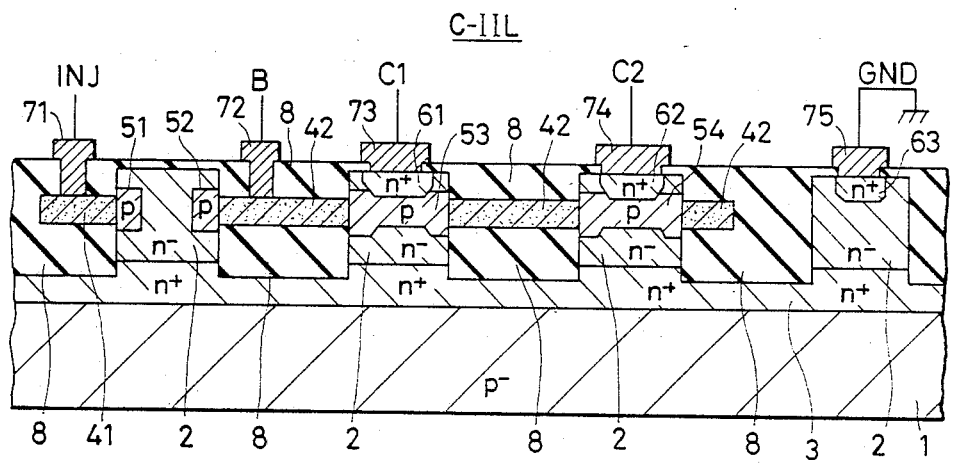
FIG. 7(a) is a sectional view of an IC when the circuit shown in FIG. 7(b) is realized in a semiconductor substrate by way of example.
Figure 7B:
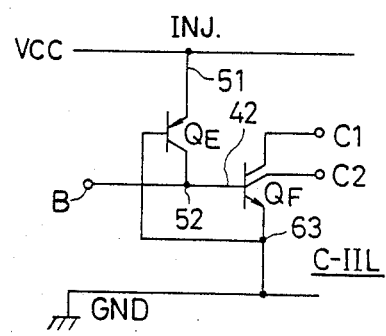
FIG. 7(b) is a circuit diagram of a common IIL (C-IIL)

FIG. 7(a) shows the device structure when the C-IIL element shown in FIG. 7(b) is fabricated using the SICOS technique.

The structure shown in FIG. 7(a) is closely anaogous to the structure shown in FIG. 6(a). More specifically, the C-IIL circuit consists of a $p^-$ type silicon semiconductor substrate 1, an $n^-$-type silicon epitaxial layer 2, an $n^+$-buried layer 3, polycrystalline silicon layers 41 and 42 containing a p-type impurity, p-type diffusion layers 51, 52, 53 and 54, $n^+$-diffusion layers 61, 62 and 63, electrodes 71, 72, 73, 74 and 75 and an oxide layer 8. The p-type diffusion layers 51, 52, 53 and 54 are formed by the p-type impurity leaking out from the polycrystalline silicon layers 41 and 42.

Symbols B and INJ represent the base and the injector, respectively.

As described above, the signal can be directly transmitted from an IIL element of a higher stage, which is higher by at least two stages, to a lower stage IIL element and a stacked IIL circuit having three or more stages can be put into practical application by employing i-IIL elements.

(b) Prevention of Transistor Breakdown

The portion B encompassed by dotted lines in FIG. 2 is particularly designed to prevent transistor breakdown. As can be seen from the drawing, when signal transmission is carried out from the output inverter $Q_5$ of a lower stage IIL to the transistor $Q_8$ of an upper stage IIL, the signal is not directly transmitted to the upper stage IIL, which is higher by at least two stages. Instead, at least two inverters are provided for each stage (the transistors $Q_6$ and $Q_7$ in FIG. 2) so that the signal can be transmitted through these inverters.

According to this circuit arrangement, the maximum impressed voltage between the emitter and collector of the transistor $Q_5$ or $Q_7$ is 1.4 V (2 $V_{BE}$ so that this transistor does not break down. A back voltage applied to the diode between the base and collector of the transistor $Q_8$ does not exceed 1.4 V, so that the diode does not break down, either.

(c) Arrangement When Connecting C-IIL and i-IIL Elements

The arrangement described hereby corresponds to the portion C encompassed by dotted lines in FIG. 2.

In other words, among the two collectors of the transistor $Q_9$, one of them is connected to the base of the transistor. This circuit arrangement forms a current mirror circuit of the transistor $Q_9$.

Figure 3A:
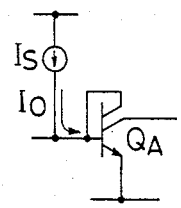
FIGS. 3(a) and 3(c) are circuit diagrams showing examples of IILs having a structure in which one of a plurality of outputs is connected to an input terminal.
Figure 3B:
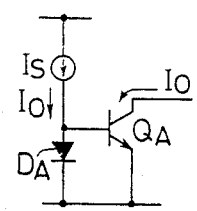
FIGS. 3(b) and 3(d) are equivalent circuit diagrams corresponding to FIGS. 3(a) and 3(c), respectively.
Figure 3C:
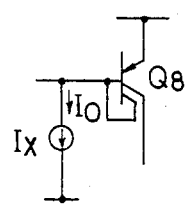
Figure 3D:
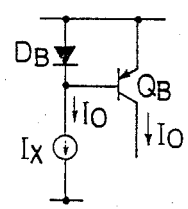

Although this circuit does not appear to be a current mirror circuit at a first glance, it is equivalent to FIG. 3(b), and is therefore a current mirror circuit. The circuit arrangement shown in FIG. 3(c) is equivalent to the circuit shown in FIG. 3(d). According to this current mirror circuit arrangement, the collector of the transistor $Q_9$ can draw the current $I_O$ from its collector irrespective of the variance of the current amplification ratio of the transistor $Q_9$, and matching the constant current source $I_X$ of IIL of the next stage can be effected more reliably.

Figure 4:
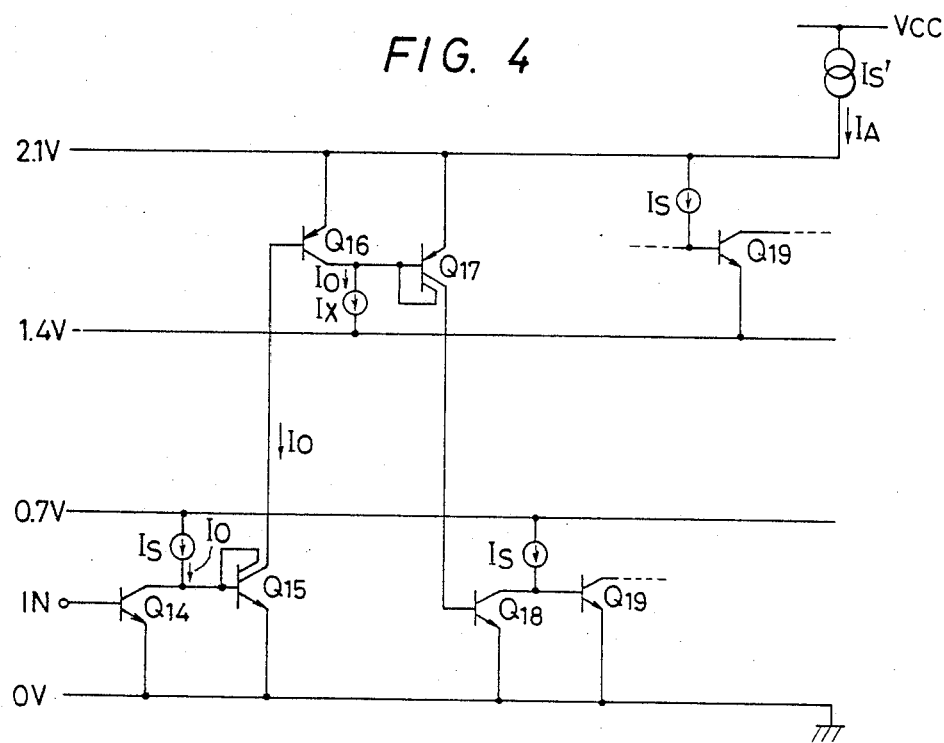
FIG. 4 is a circuit diagram showing a variation of the FIG. 2 embodiment of the present invention.

The effect of the current-mirror when connecting C-IIL elements to i-IIL elements becomes particularly remarkable when studied in conjunction with the circuit arrangement of FIG. 4.

It will first be assumed that the current mirror is not used when connecting C-IIL and i-IIL elements in FIG. 4. In such a case, when the input (IN) is at the "L" level, the transistor $Q_{14}$ is turned off, while the transistor $Q_{15}$ is turned on. Then, a large current flows from the high potential line of 2.1 V through the emitter and base of the PNP transistor $Q_{16}$ and through the collector-emitter path of the transistor $Q_{15}$. Without the provision of a current mirror, most of the current $I_4$ delivered from the basic constant current source $I_S'$ of the stacked IIL will flow through the paths described above, and the injection current will not be supplied to the base of the transistor $Q_{19}$.

Such a problem occurs because the transistor $Q_{15}$ serves as a mere switch if no current mirror arrangements are made. Therefore, the transistors $Q_{15}$ and $Q_{17}$ are arranged in the circuit of FIG. 4 to constitute the current mirror such as shown in FIGS. 3(a) through 3(d). With this arrangement, the current drawn into or pumped out from the transistors $Q_{15}$ and $Q_{17}$ can be aligned, and the erroneous operation described above does not occur.

Figure 5:
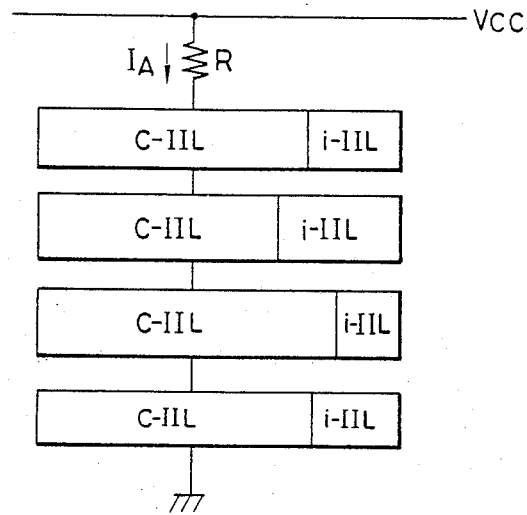
FIG. 5 is a block diagram showing another embodiment of the present invention.

Such a circuit arrangement can realize a multi-stage IIL of three or more stages that has not been accomplished conventionally. The invention is not particularly limited to the circuit arrangement shown in FIGS. 3(a) through 3(d). For example, a four-stage arrangement such as shown in FIG. 5 can be realized using the present invention. Furthermore, a multi-stage IIL circuit of five or more stages can be realized within the limits imposed by the breakdown voltages of the transistors.

In accordance with the present invention, C-IIL and i-IIL elements co-exist at suitable ratio to achieve the advantages discussed above.

Embodiment 2

As described above, a drastic reduction of power consumption can be accomplished when a multi-stage IIL is realized. Using such a multi-stage IIL, various application examples can be realized. This embodiment illustrates one of such application examples, and its definite construction is shown in FIG. 8.

Figure 8:
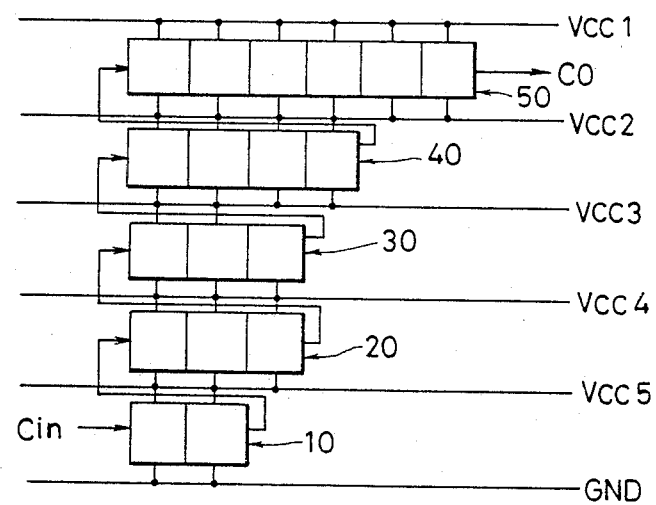
FIG. 8 is a block diagram of another embodiment of the invention, which shows the structure of a counter using a multi-stage IIL.

The multi-stage IIL circuit shown in FIG. 8 has a five-stage stacked structure. A high speed count input $C_{in}$ applied to the lowermost IIL circuit 10 is sequentially transmitted to IIL circuits 20, 30, 40 and 50 of higher stages while its frequency is being divided, and the frequency-divided count output $C_0$ is obtained from the IIL circuit 50 of the uppermost stage.

Here, the number of the IILs contained in the IIL circuit 10–50 of each stage is different between the lower stages and the upper stages and increases progressively from the lower stages to the upper stages. Accordingly, the operating voltages between the stages ($V_{cc1}-V_{cc2}$, $V_{cc2}-V_{cc3}$, $V_{cc3}-V_{cc4}$, $V_{cc4}-V_{cc5}$, $V_{cc5}$-GND) are divided substantially equal to one another, but the operating current flowing through the IIL circuit of each stage becomes progressively greater from the upper stages to the lower stages so that the greatest operating current flows through the lowermost IIL circuit 10 to which the count input $C_{in}$ is applied. Therefore, the operating speed can be obtained at the lowermost IIL circuit 10. According to this circuit arrangement, an operating speed sufficient to cope with the count input $C_{in}$ that changes at a high speed can be obtained on the pre-stage side of the counter, while the operating current is reduced to reduce the power consumption on the post-stage of the counter.

It is to be understood that the above-described arrangements are simply illustrative of the application of the principles of this invention. Numerous other arrangements may be readily devised by those skilled in the art which embody the principles of the invention and fall within its spirit and scope.

We claim:

1. An integrated injection logic (IIL) circuit comprising:

first IIL elements, each including a PNP transistor coupled to operate as an injector for the IIL element and an NPN transistor coupled to said PNP transistor to operate as an inverter; and second IIL elements, each including an NPN transistor coupled to operate as an injector for the IIL element and a PNP transistor coupled to said NPN transistor to operate as an inverter, wherein an output inverter formed by one of said NPN transistors of one of said first IIL elements is coupled to an input of one of said second IIL elements, and further wherein said one of said NPN transistors forming said output inverter has a plurality of outputs, one of which outputs is coupled to the input of said one of said second IIL elements and one of which is coupled to an input terminal of said output inverter.

2. An integrated injection logic (IIL) circuit comprising:

first IIL elements, each including a PNP transistor coupled to operate as an injector for the IIL element and an NPN transistor coupled to said PNP transistor to operate as an inverter; and second IIL elements, each including an NPN transistor coupled to operate as an injector for the IIL element and a PNP transistor coupled to said NPN transistor to operate as an inverter, wherein said IIL circuit has a stacked structure in which at least two IIL elements selected from said first and second IIL elements are connected in series between a first operating potential and a second operating potential, wherein the first operating potential is greater than the second operating potential, and wherein said second IIL elements in said IIL circuit of the stacked structure are connected to operate as signal transmission elements to transmit signals from predetermined IIL elements connected to the first operating potential to other predetermined IIL elements connected to the second operating potential.

3. An IIL circuit according to claim 2, wherein said other predetermined IIL elements connected to the first and second operating potentials are first IIL elements.

4. A multi-stage integrated injection logic (IIL) circuit comprising:

a first operating potential line;

a second operating potential line having a potential level lower than that of the first operating potential line;

a third operating potential line having a potential level lower than that of the second operating potential line;

a fourth operating potential line having a potential level lower than that of the third operating potential line;

a first IIL element coupled between the third and fourth operating potential lines and having a PNP transistor coupled to operate as an injector for the first IIL element and an NPN transistor coupled to said PNP transistor to operate as an inverter;

a second IIL element coupled between the first and second operating potential lines and having an NPN transistor coupled to operate as an injector for the second IIL element and a PNP transistor coupled to said NPN transistor to operate as an inverter, wherein the NPN inverter of said first IIL element has an output coupled to an input of the second IIL element; and a third IIL element coupled between the third and fourth operating potential lines, wherein an output of the PNP inverter of the second IIL element is coupled to an input of the third IIL element.

5. A multi-stage IIL circuit according to claim 4, wherein the third IIL element has a PNP transistor coupled to operate as an injector for the third IIL element and an NPN transistor coupled to the PNP transistor to operate as an inverter.

6. A multi-stage IIL circuit according to claim 4, wherein the output of the NPN inverter transistor of the first IIL element is coupled to the input of the second IIL element through at least two inverter circuits coupled between the second and third operating potential lines.

7. A multi-stage IIL circuit according to claim 4, wherein the NPN inverter transistor of the first IIL element has a first collector coupled to the input of the second IIL element and has a second collector coupled to its own base to form a current mirror circuit.

8. A multi-stage IIL circuit according to claim 4, wherein said PNP inverter transistor of the second IIL element has a first collector coupled to the input of the third IIL element and a second collector coupled to its own base.

9. An integrated injection logic (IIL) circuit comprising:
- an input terminal;
- a first operating potential line;
- a second operating potential line having a potential lower than that of the first operating potential line; and
- a first IIL element including:
    - an NPN transistor having its base coupled to said first operating potential line and its collector-emitter path coupled between said input terminal and said second operating potential line so that said NPN transistor operates as an injector for said first IIL element; and
    - a PNP transistor having its base coupled to said input terminal and its emitter coupled to said first operating potential line, said PNP transistor including a plurality of collectors providing output terminals for said first IIL element, wherein said PNP transistor operates as an inverter for said first IIL element.

* * * * *